United States Patent
Wu et al.

(10) Patent No.: US 8,710,359 B2
(45) Date of Patent: Apr. 29, 2014

(54) DISPLAY MODULE

(75) Inventors: Hsing-Hua Wu, Kaohsiung (TW);
Chian-Fu Huang, Keelung (TW);
Wei-Yuan Cheng, Taipei County (TW);
Jyh-Wen Shiu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1084 days.

(21) Appl. No.: 12/637,768

(22) Filed: Dec. 15, 2009

(65) Prior Publication Data

US 2011/0109607 A1 May 12, 2011

(30) Foreign Application Priority Data

Nov. 6, 2009 (TW) .............................. 98137836 A

(51) Int. Cl.
*H01L 31/00* (2006.01)

(52) U.S. Cl.
USPC ............ 136/259; 136/252; 136/258; 136/261

(58) Field of Classification Search
USPC ......... 136/244, 251, 252, 255, 258, 259, 261; 349/162; 345/211
See application file for complete search history.

(56) References Cited

U.S. PATENT DOCUMENTS

| | | | |
|---|---|---|---|
| 4,095,217 A * | 6/1978 | Tani et al. | 345/87 |
| 6,080,998 A * | 6/2000 | Shima et al. | 257/55 |
| 6,518,944 B1 | 2/2003 | Doane et al. | |
| 7,136,138 B1 * | 11/2006 | Sekiguchi et al. | 349/162 |
| 7,319,465 B2 | 1/2008 | Mikami et al. | |
| 7,460,188 B2 | 12/2008 | Brummack et al. | |
| 2002/0027620 A1 | 3/2002 | Platz et al. | |
| 2005/0225686 A1 * | 10/2005 | Brummack et al. | 349/1 |
| 2006/0284894 A1 * | 12/2006 | Johnson et al. | 345/690 |
| 2010/0245731 A1 * | 9/2010 | Limketkai et al. | 349/106 |

FOREIGN PATENT DOCUMENTS

| | | |
|---|---|---|
| TW | 200506771 | 2/2005 |
| TW | I316217 | 10/2009 |

OTHER PUBLICATIONS

Lao et al, Ultra-High Transmission Electrowetting Displays Enabled by Integrated Reflectors, Jounal of Display Technology, vol. 4, No. 2, Jun. 2008.
A. Giraldo et al, 34.2: Transmissive Electrowetting-Based Displays for Portable Multi-Media Devices, SID 09 Digest, pp. 479-482, 2009.
A. Khan et al. 56.1: Invited Paper: Recent Progress in Flexible and Drapable Reflective Cholesteric Displays, SID 06 Digest, pp. 1728-1731, 2006.
"Office Action of Taiwan counterpart application" issued on Nov. 8, 2013, p1-p7, in which the listed references were cited.

* cited by examiner

*Primary Examiner* — Jonathan Johnson
*Assistant Examiner* — Lindsey Bernier
(74) *Attorney, Agent, or Firm* — Jianq Chyun IP Office

(57) ABSTRACT

A display module is provided, which includes a first and a second substrates, a transparent type solar cell, a display device, an electric power storage device, a driving circuit and a power supply transfer switch. In the display module, the first substrate, the transparent type solar cell, the display device and the second substrate are successively arranged according to an incident direction of a light source. The transparent type solar cell has a visible light transmittance of 10%-40% and a color temperature (Tc) larger than 2400K. The electric power storage device is connected to the transparent type solar cell for storing electric power there from, and the driving circuit is connected to the display device for driving the same. The power supply transfer switch is used for transferring the electric power into the electric power storage device or the driving circuit.

16 Claims, 4 Drawing Sheets

DISPLAY MODULE

CROSS-REFERENCE TO RELATED APPLICATION

This application claims the priority benefit of Taiwan application serial no. 98137836, filed on Nov. 6, 2009. The entirety of the above-mentioned patent application is hereby incorporated by reference herein and made a part of this specification.

BACKGROUND OF THE INVENTION

1. Field of the Invention

The present invention relates to a display module and applications of the same.

2. Description of Related Art

Solar energy is a pollution-free and inexhaustible energy. Therefore, when problems of pollution and shortage of petroleum energy are encountered, how to effectively use the solar energy becomes a focus of attention. Since a solar cell can directly convert the solar energy into electric power, it becomes a development priority of using the solar energy. Wherein, a building integrated photovoltaic (BIPV) is an important application and market of the silicon thin film solar cell in the future.

The BIPV solar cell is different to a conventional solar cell, in which besides an efficiency thereof is considered, it has to be considered to not spoil aesthetics of a building. In addition, if an erect and transparent type BIPV is applied to a part of the building (for example, windows and patios, etc.) that requires nature lighting, a visual comfort degree thereof has to be considered. Moreover, as the display industry is stably developed in Taiwan, a smart window combining concepts of the building and the display is also developed.

A solar-powered liquid crystal display (LCD) is disclosed in U.S. Pat. No. 7,460,188, which includes a solar cell, a LCD and a liquid crystal layer disposed between the solar cell and the LCD. However, since the solar cell of this patent is just deployed around a display area, an effective power-generating area is small, so that a power efficiency thereof is limited by the size of the display area.

Although a transparent type solar cell having transparent upper and lower electrodes is developed, since a silicon thin film serving as an absorbing layer has a strong absorbability for short wavelengths, a transmissive spectrum is mainly formed by long wavelengths. Therefore, the whole transmissive spectrum presents a color range from orange-red to dark red (i.e. a low color temperature of about 1500K), which can cause discomfort to human eyes, so that it is not suitable for being applied to displays.

SUMMARY OF THE INVENTION

The disclosure is directed to a display module having a display function, in which a power-generating area and a performance of a solar cell can be increased.

A display module for absorbing light from a light source is provided. The display module includes a first substrate, a transparent type solar cell, a display device, a second substrate, an electric power storage device, a driving circuit and a power supply transfer switch. The transparent type solar cell is located on a surface of the first substrate relative to an incident direction of the light source for absorbing the light source and converting the light source into electric power, wherein a visible light transmittance of the transparent type solar cell is 10%-40%, and a color temperature of the transparent type solar cell is greater than 2400K. The display device is located on a surface of the transparent type solar cell relative to the incident direction of the light source. The second substrate is located on a surface of the display device relative to the incident direction of the light source. The electric power storage device is connected to the transparent type solar cell for storing the electric power. The driving circuit is connected to the display device for driving the display device. The power supply transfer switch is used for switching the electric power to the electric power storage device or the driving circuit.

The disclosure further provides a used of the display module, which is applied to a building integrated photovoltaic (BIPV) design.

The disclosure yet provides a use of the display module, which is applied as an e-book or an outdoor billboard.

According to the above descriptions, in the display module of the disclosure, a display device and a transparent type solar cell having a high visible light transmittance are used, so that the transparent type solar cell can be disposed right above the display device in case that the display effect is not influenced. Therefore, a power-generating area of the transparent type solar cell can include a display area and a surround area thereof, so that a power-generating efficiency is greatly increased.

In order to make the aforementioned and other features of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
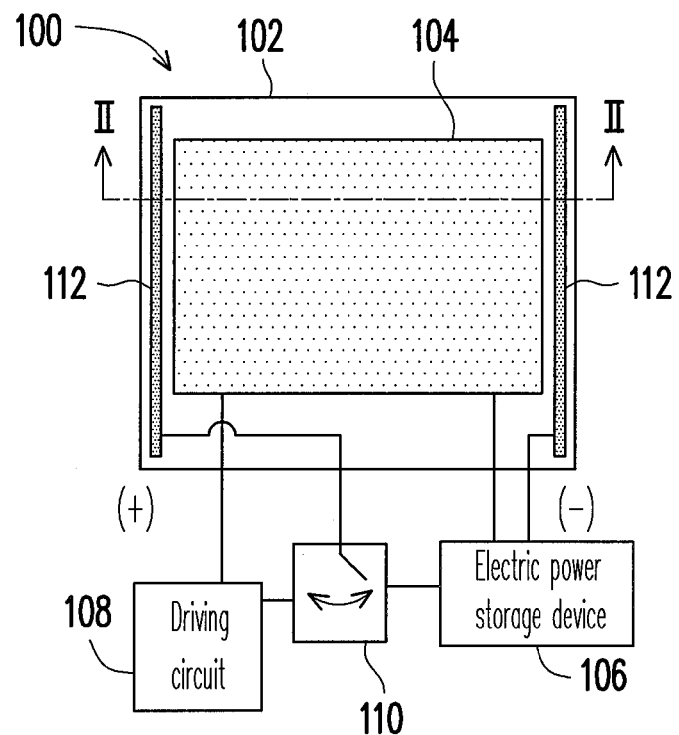
FIG. 1 is a schematic diagram illustrating a display module according to a first embodiment of the disclosure.

Embodiments are provided below with reference of drawings to fully describe the technique of the disclosure. Although the embodiments of the disclosure are illustrated by following drawings, the disclosure can still be implemented by different approaches, and is not limited to the provided embodiments. For clarity, sizes and relative sizes of layers and regions in the drawings are not scaled.

FIG. 1 is a schematic diagram illustrating a display module according to a first embodiment of the disclosure.

Referring to FIG. 1, the display module 100 of the first embodiment includes a transparent type solar cell 102, a display device 104, an electric power storage device 106, a driving circuit 108 and a power supply transfer switch 110. A visible light (with a wavelength of 500 nm-800 nm) transmittance of the transparent type solar cell 102 is 10%-40%, and a color temperature (Tc) of the transparent type solar cell 102 is greater than 2400K. The display device 104 is disposed on a surface of the transparent type solar cell 102, wherein the display device 104 has one or a plurality of light reflection, absorption, and emission bands. The electric power storage device 106 is connected to the transparent type solar cell 102 for storing the electric power. Generally, the electric power storage device 106 can be connected to an anode/cathode 112 of the transparent type solar cell 102. The driving circuit 108 is connected to the display device 104 for driving the display device 104. The power supply transfer switch 110 is used for switching the electric power to the electric power storage device 106 or the driving circuit 108. When image pixels in the display device 104 are required to be driven, the electric power can be output to the driving circuit 108 through the power supply transfer switch 110, so as to switch a displayed image, and when the image is not switched, the electric power of the transparent type solar cell 102 is directly stored in the electric power storage device 106.

Figure 2:
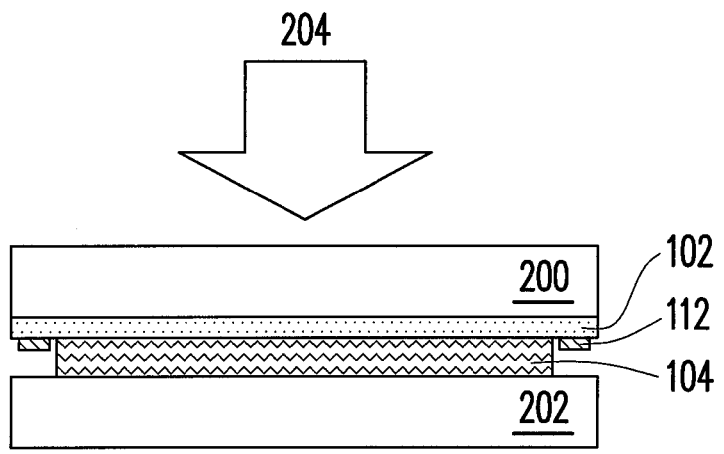
FIG. 2 is a cross-sectional view of FIG. 1 along a section line II-II.

FIG. 2 is a cross-sectional view of FIG. 1 along a section line II-II. Referring to FIG. 2, the display module 100 of the first embodiment further includes a first substrate 200 and a second substrate 202. In view of a light incident direction of a light source 204, the transparent type solar cell 102 covers a surface of the first substrate 200 relative to the incident direction of the light source 204 for absorbing the light source 204 and converting it into electric power. The display device 104 is located on a surface of the transparent type solar cell 102 relative to the incident direction of the light source 204. The second substrate 202 is located on a surface of the display device 104 relative to the incident direction of the light source 204. Since the visible light transmittance and the color temperature of the transparent type solar cell 102 can satisfy a demand of visual comfort of human eyes, the transparent type solar cell 102 can be totally overlapped to the display device 104, so as to increase a power-generating area and an output power.

Referring to FIG. 2 again, the first substrate 200 is generally a transparent substrate, so as to let the light source 204 passing through. The second substrate 202 can be a transparent substrate or a substrate having a total reflection function according to an application of the display module 100. For example, when the display module 100 is applied to a building integrated photovoltaic (BIPV) design, the first and the second substrates 200 and 202 are all transparent substrates, so as to implement a dual-side display effect, and when the display module 100 is applied as an e-book or an outdoor billboard, the second substrate 202 can be a substrate having the total reflection function.

In the disclosure, the required visible light transmittance and the color temperature can be achieved by controlling a thickness of the absorbing layer of the transparent type solar cell 102. Detailed descriptions are as follows.

Figure 3:
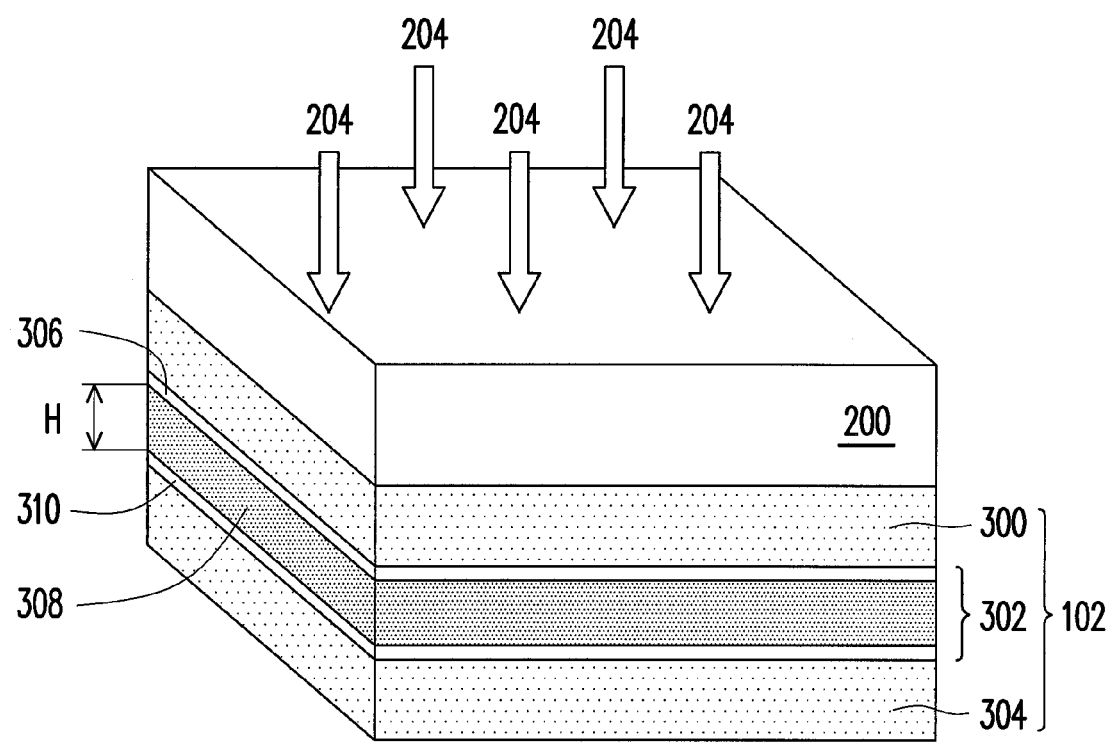
FIG. 3 is a three-dimensional diagram of a transparent type solar cell of the first embodiment.

FIG. 3 is a three-dimensional diagram of the transparent type solar cell 102 of the first embodiment. Referring to FIG. 3, the transparent type solar cell 102 is formed on the surface of the first substrate 200 relative to the incident direction of the light source 204, wherein the transparent type solar cell 102 includes a first transparent electrode layer 300, a photoelectric conversion layer 302, and a second transparent electrode layer 304. The first transparent electrode layer 300 and the second transparent electrode layer 304 are, for example, general transparent conductive oxide (TCO), such as AZO, GZO, $TiO_2$, ITO or $SnO_2$. The photoelectric conversion layer 302 is generally a PIN structure or a NIP structure. In FIG. 3, a reference numeral 308 represents the absorbing layer (i.e. I-layer), and reference numerals 306 and 310 represent a P/N layer and a N/P layer according to an actual requirement. The absorbing layer 308 has, for example, an energy bandgap of 3.0 eV-1.2 eV.

Since a magnitude of the color temperature is directly related to a thickness H of the absorbing layer 308, the larger the thickness H of the absorbing layer 308 is, the harder for the short wavelengths penetrating there through, and the lower (red-shifted) the color temperature of the transmissive light is. Similarly, the lower the energy bandgap of the material is, the stronger absorption for the short wavelengths is, and the lower the color temperature of the transmissive light is (which presents a dark red). Therefore, to achieve an effect of high color temperature, the absorbing layer 308 having different energy bandgaps requires different thickness ranges. Regarding different materials of the absorbing layer 308, maximum thickness thereof are set as below.

1. When the energy bandgap of the absorbing layer 308 is 1.6 eV≥Eg>1.20 eV, a range of the thickness H is 30 nm<H<120 nm, and a material of the absorbing layer 308 in accord with such energy bandgap is, for example, a-SiGe$_x$, etc.
2. When the energy bandgap of the absorbing layer 308 is 2.0 eV>Eg>1.6 eV, a range of the thickness H is 40 nm<H<150 nm, and a material of the absorbing layer 308 in accord with such energy bandgap is, for example, a-Si:H, or a-Si:F:H, etc.
3. When the energy bandgap of the absorbing layer 308 is 3.0 eV>Eg>2.0 eV, a range of the thickness H is 100 nm≤H<400 nm, and a material of the absorbing layer 308 in accord with such energy bandgap is, for example, a-SiO$_x$ or a-SiC$_x$, etc.

Regarding the transparent type solar cell 102 in accord with the above thickness conditions, the visible light transmittance thereof is about 10%-40%, and the color temperature (Tc) of the transparent type solar cell 102 is greater than 2400K, which can satisfy a demand of visual comfort of human eyes.

To verify the effect of the transparent type solar cell 102, the transparent type solar cell of the first embodiment is actually fabricated, and the color temperature, a color rendering (Ra) and the visible light transmittance thereof are measured.

First Experiment

A transparent type solar cell with a structure of glass/GZO/P-layer/I-layer/N-layer/GZO is fabricated, wherein a thickness of the glass (equivalent to the first substrate 200) is about 4 mm, a thickness of the first layer of GZO (equivalent to the first transparent electrode layer 300) is about 600 nm, and a thickness of the second layer of GZO (equivalent to the second transparent electrode layer 304) is about 800 nm. The photoelectric conversion layer 302 formed by the PIN structure does not influence a quality of the transmissive light due to that thickness of the P-layer 306 and the N-layer 310 are very tiny. The Mayer 308 in the photoelectric conversion layer 302 is a-Si:H:F with a thickness of 80 nm. The actual color temperature (Tc) of the above transparent type solar cell is about 2460K.

Second Experiment

A transparent type solar cell structure similar to that of the first experiment is fabricated, wherein only the material of the Mayer is changed to a-SiGe:H with a same thickness compared to that of a-Si:H:F of the first experiment.

Comparison Experiment

A solar cell structure similar to that of the first experiment is fabricated, wherein only the thickness of the I-layer is changed compared to that of the first experiment. The thickness of the Mayer of the comparison experiment is about 300-400 nm, so that a whole color thereof is auburn.

Visible Light Transmittance

Figure 4:
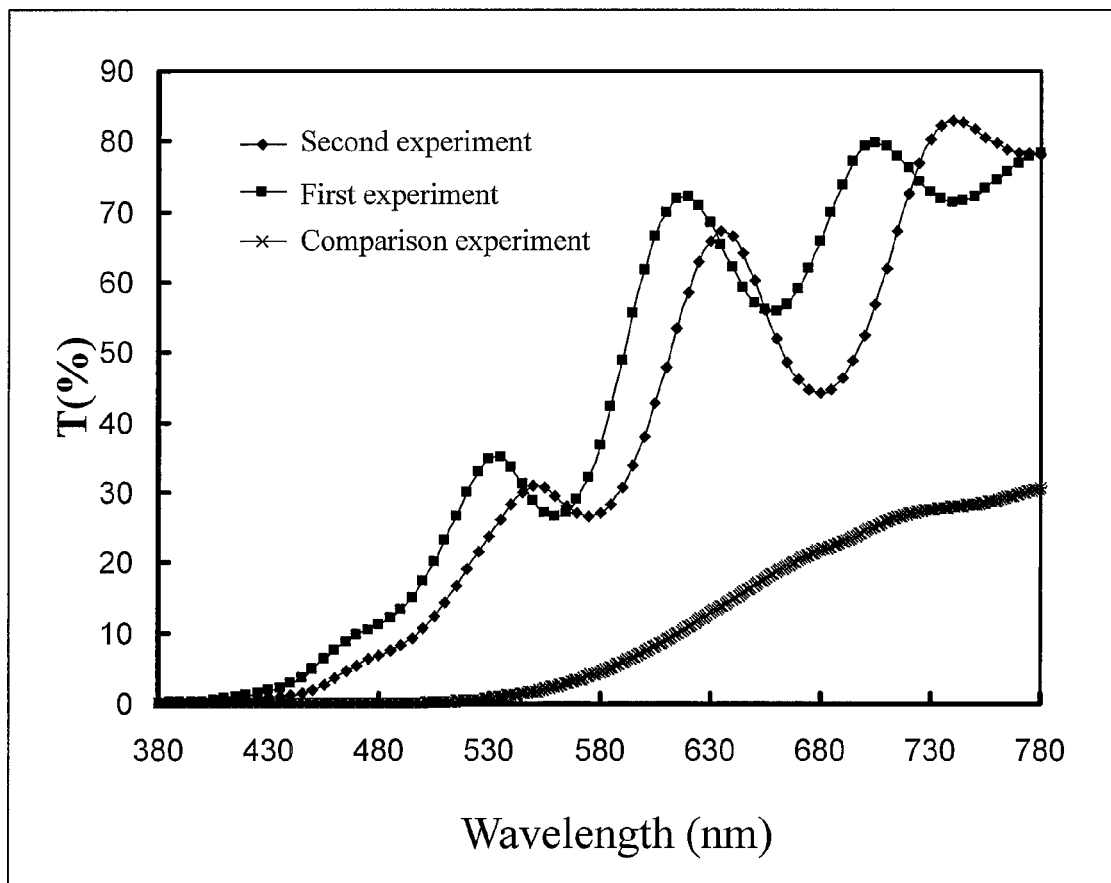
FIG. 4 is a curve diagram illustrating a relation between wavelengths and transmittances of transparent type solar cells of first and second experiments and a comparison experiment.

The visible light transmittances of the solar cells of the first experiment, the second experiment and the comparison experiment are measured to obtain curves of FIG. 4. According to FIG. 4, it is known that the visible light transmittances of the transparent type solar cells of the first experiment and the second experiment are obviously better than that of the solar cell of the comparison experiment. A following table 1 lists actual values of the visible light transmittances of the first experiment, the second experiment and the comparison experiment.

TABLE 1

| Visible light transmittance (T) | |
| --- | --- |
| First experiment | 41.24% |
| Second experiment | 35.69% |
| Comparison experiment | 10.20% |

Moreover, the display device in the display module of the first embodiment may have a transmissive, an absorptive or a reflective display medium, and two embodiments thereof are provided below.

Figure 5:
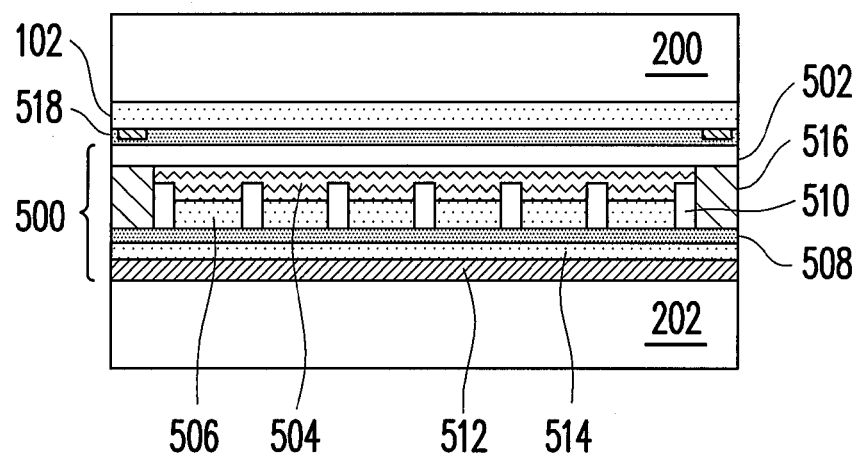
FIG. 5 is a cross-sectional view of a first variation of FIG. 2.

FIG. 5 is a cross-sectional view of a first variation of FIG. 2, wherein the same reference numerals in FIG. 5 and FIG. 2 denote the same elements. In FIG. 5, a display device 500 used in coordination with the transparent type solar cell 102 is a so-called "electrowetting display (EWD) device". The EWD device 500 includes a common electrode 502, polar liquid 504, non-polar liquid 506, a hydrophobic layer 508, hydrophilic ribs 510 that divide the non-polar liquid 506 into a plurality of pixels, a pixel electrode 512, a dielectric layer 514 disposed between the hydrophobic layer 508 and the pixel electrode 512, and a sealant 516. Moreover, a passivation layer 518 is generally disposed between the transparent type solar cell 102 and the EWD device 500 for isolation. Generally, when the EWD device 500 is not powered, the non-polar liquid 506 (for example, color ink) under the polar liquid 504 (for example, water) is spread on a surface of the hydrophobic layer 508. When the EWD device 500 is powered, the non-polar liquid 506 is shrunk to a little ball.

Figure 6:
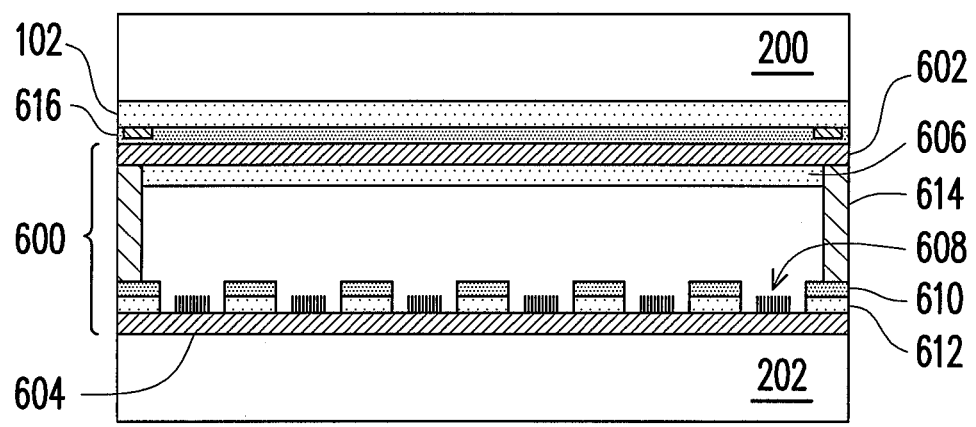
FIG. 6 is a cross-sectional view of a second variation of FIG. 2.

FIG. 6 is a cross-sectional view of a second variation of FIG. 2, wherein the same reference numerals in FIG. 6 and FIG. 2 denote the same elements. In FIG. 6, a display device 600 used in coordination with the transparent type solar cell 102 is a so-called "nanotube field-emission display (FED) device". The nanotube FED device 600 includes an anode 602, a cathode 604, a phosphor 606 disposed on a surface of the anode 602, a nanotube 608 disposed on the cathode 604 relative to the phosphor 606, a gate electrode 610 that divides the nanotube 608 into a plurality of pixels, a dielectric layer 612 disposed between the gate electrode 610 and the cathode 604, and a spacer 614. Moreover, a passivation layer 616 is generally disposed between the transparent type solar cell 102 and the nanotube FED device 600 for isolation.

Besides the display devices shown in FIG. 5 and FIG. 6, the other suitable display devices can also be used according to actual applications, which is not limited by the disclosure.

In summary, in the display module of the disclosure, a display device and a transparent type solar cell having a high color temperature and a high visible light transmittance are used, so that a power-generating area of the transparent type solar cell can include a display area and a surround area thereof, and therefore the power-generating area is increased and a power-generating efficiency is greatly increased. Moreover, the display module of the disclosure can be applied to product designs of BIPVs, e-books or outdoor billboards, etc.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A display module for absorbing a light source, comprising:
    a first substrate;
    a transparent type solar cell, located on a surface of the first substrate relative to an incident direction of the light source for absorbing and converting the light source into electric power, wherein the transparent type solar cell comprises a first transparent electrode layer, a photoelectric conversion layer, and a second transparent electrode layer, and the photoelectric conversion layer substantially covers an entirety of the first substrate, wherein a visible light transmittance of the transparent type solar cell is 10%-40%, and a color temperature (Tc) of the transparent type solar cell is greater than 2400K;
    a display device, located on a surface of the transparent type solar cell relative to the incident direction of the light source;
    a second substrate, located on a surface of the display device relative to the incident direction of the light source;
    an electric power storage device, connected to the transparent type solar cell for storing the electric power;
    a driving circuit, connected to the display device for driving the display device; and
    a power supply transfer switch, for switching the electric power to one of the electric power storage device and the driving circuit.

2. The display module as claimed in claim 1, wherein the photoelectric conversion layer has an absorbing layer, and an energy bandgap of the absorbing layer is 3.0 eV-1.2 eV.

3. The display module as claimed in claim 2, wherein the photoelectric conversion layer comprises a PIN structure or a NIP structure.

4. The display module as claimed in claim 2, wherein when the energy bandgap (Eg) of the absorbing layer is 1.6 eV≥Eg>1.2 eV, a thickness of the absorbing layer is greater than 30 nm and is smaller than 120 nm.

5. The display module as claimed in claim 4, wherein a material of the absorbing layer comprises a-SiGex.

6. The display module as claimed in claim 2, wherein when the energy bandgap of the absorbing layer is 2.0 eV>Eg>1.6 eV, a thickness of the absorbing layer is greater than 40 nm and is smaller than 150 nm.

7. The display module as claimed in claim 6, wherein a material of the absorbing layer comprises a-Si:H or a-Si:H:F.

8. The display module as claimed in claim 2, wherein when the energy bandgap of the absorbing layer is 3.0 eV>Eg>2.0 eV, a thickness of the absorbing layer is greater than 100 nm and is smaller than 400 nm.

9. The display module as claimed in claim 8, wherein a material of the absorbing layer comprises a-SiOx or a-SiCx.

10. The display module as claimed in claim 1, wherein the first transparent electrode layer comprises AZO, GZO, TiO2, ITO or SnO2.

11. The display module as claimed in claim 1, wherein the second transparent electrode layer comprises AZO, GZO, TiO2, ITO or SnO2.

12. The display module as claimed in claim 1, wherein the display device has a transmissive, an absorptive or a reflective display medium.

13. The display module as claimed in claim 12, wherein the display device comprises an electrowetting display (EWD) device.

14. The display module as claimed in claim 12, wherein the display device comprises a nanotube field-emission display (FED) device.

15. The display module as claimed in claim 1, wherein the first substrate is a transparent substrate.

16. The display module as claimed in claim 1, wherein the second substrate comprises a transparent substrate or a substrate having a total reflection function.

* * * * *